United States Patent [19]
McWilliams

[11] 3,969,667
[45] July 13, 1976

[54] DEVICE FOR DETERMINING THE STATE OF CHARGE IN BATTERIES

[75] Inventor: Gerald E. McWilliams, San Diego, Calif.

[73] Assignee: The United States of America as represented by the Secretary of the Navy, Washington, D.C.

[22] Filed: Dec. 20, 1974

[21] Appl. No.: 534,990

Related U.S. Application Data

[63] Continuation-in-part of Ser. No. 283,141, Aug. 23, 1972, abandoned.

[52] U.S. Cl. .............................. 324/29.5; 324/182; 320/43
[51] Int. Cl.² ........................................ G01N 27/42
[58] Field of Search ............ 324/29.5, 62, 182, 133; 320/21, 29, 32, 39, 43, 48, 13, 9, 44

[56] References Cited
UNITED STATES PATENTS

| | | | |
|---|---|---|---|
| 3,577,168 | 5/1971 | Tuten | 324/182 |
| 3,676,770 | 7/1972 | Sharat | 324/29.5 |
| 3,680,072 | 7/1972 | Charbonnier | 324/29.5 |
| 3,750,011 | 7/1973 | Kreps | 324/29.5 |
| 3,753,094 | 8/1973 | Furuishi | 324/29.5 |
| 3,805,157 | 4/1974 | Acks | 324/29.5 |
| 3,816,807 | 6/1974 | Taylor | 324/29.5 |

OTHER PUBLICATIONS
3,577,168 05001971 Tuten 324 182

Primary Examiner—R. V. Rolinec
Assistant Examiner—Michael J. Tokar
Attorney, Agent, or Firm—R. S. Sciascia; G. J. Rubens; T. M. Phillips

[57] ABSTRACT

A device for determining the state of charge in batteries. The battery under test is discharged to its maximum capability by controlling the discharge current in a linear manner. The product of the current and battery voltage is recorded until the battery power reaches maximum at the maximum power point. The readings, peak power and the potential of the battery at the peak power, are held on meters by peak read and hold and track and hold circuits, respectively. From the readings obtained the state of charge can be determined by using a calibration curve for the type of battery being tested.

2 Claims, 3 Drawing Figures

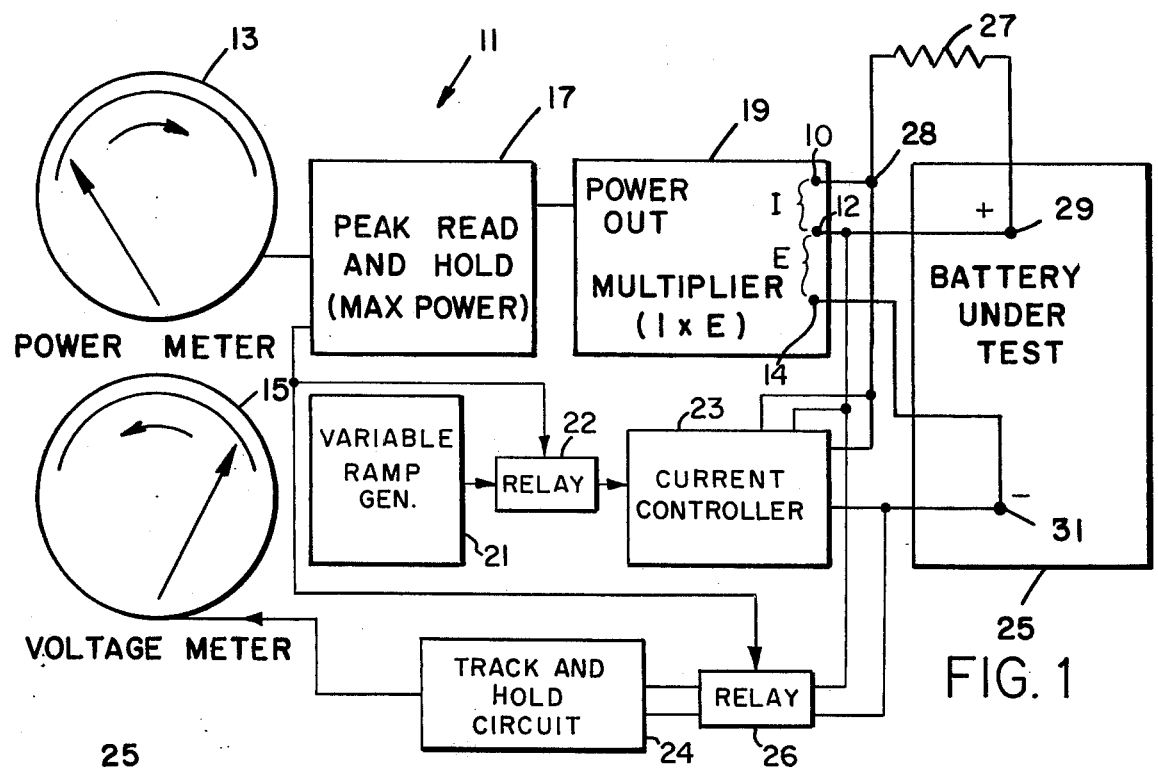
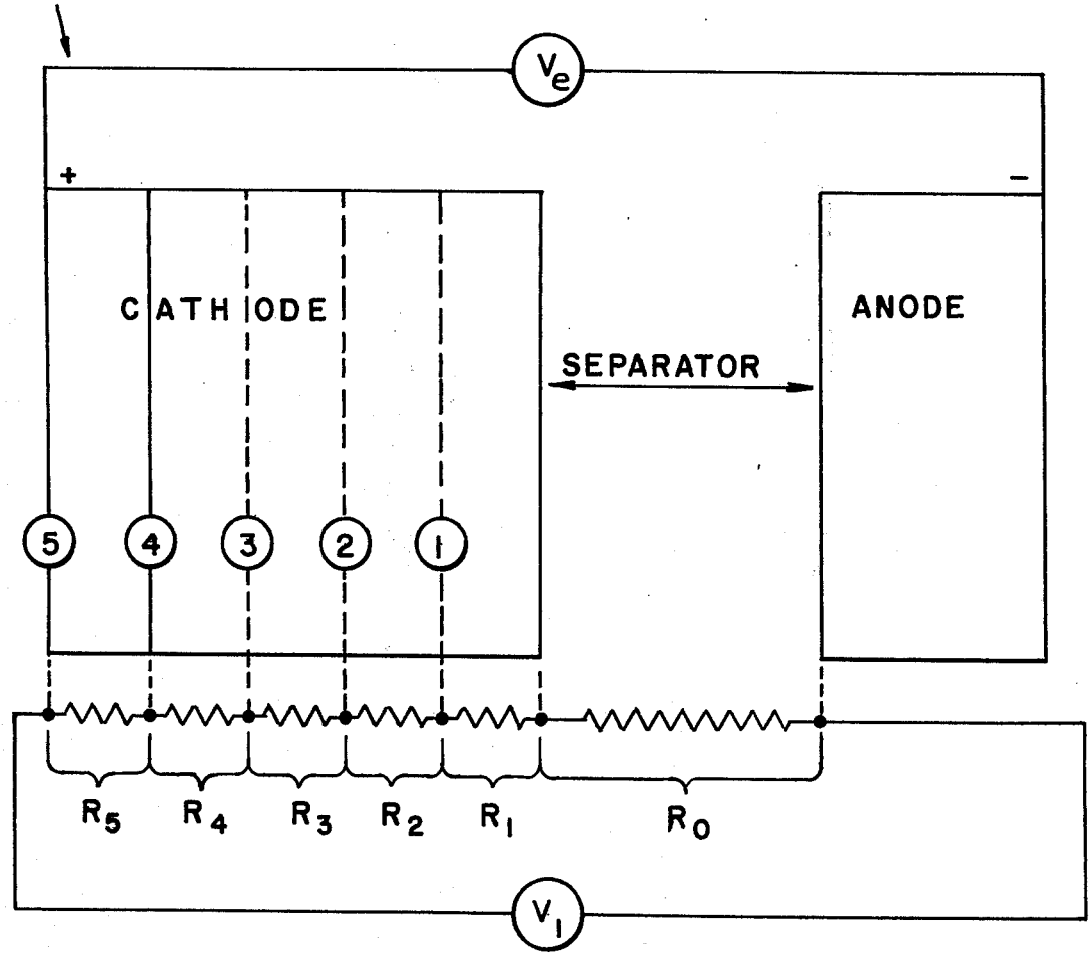

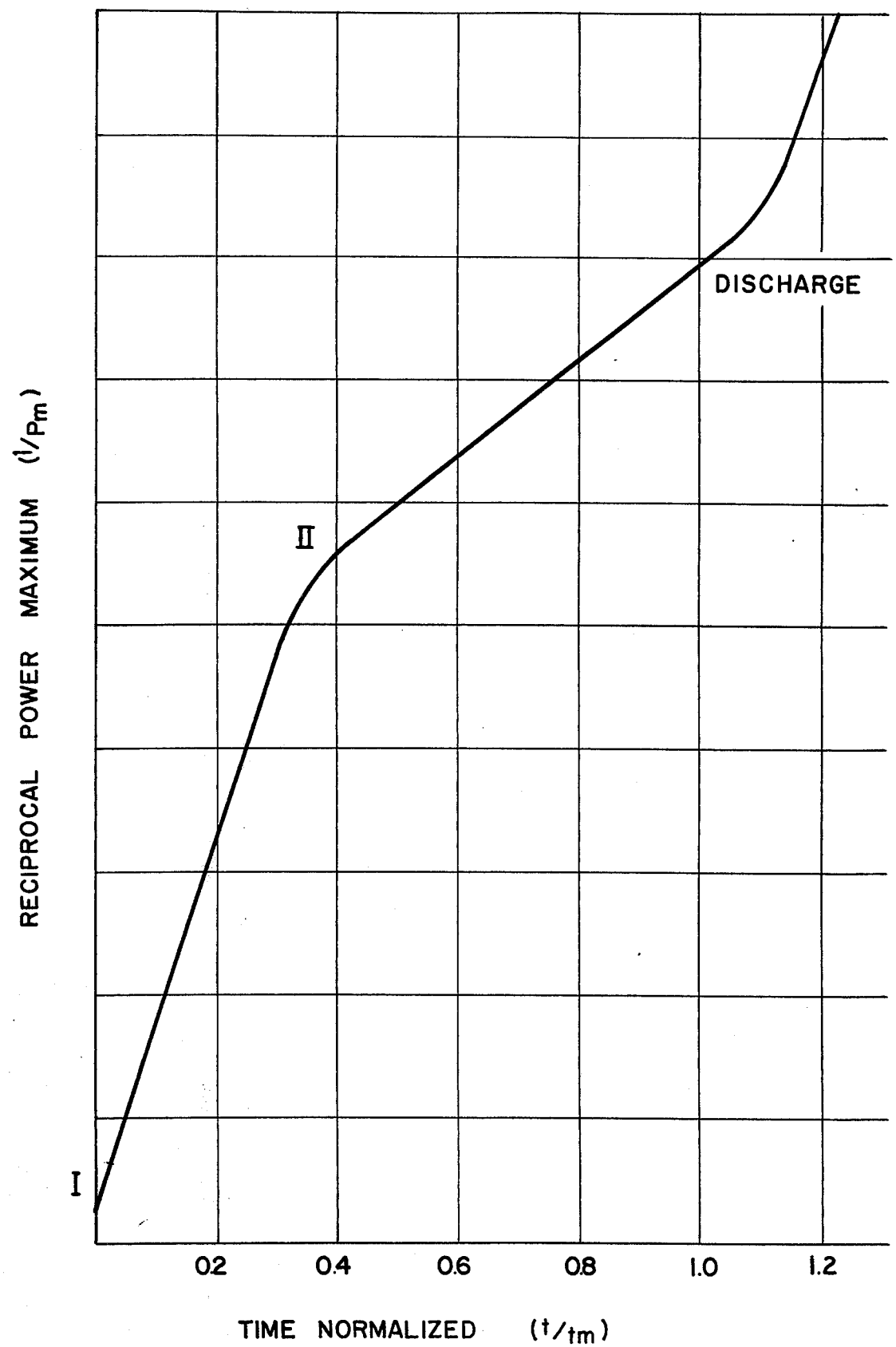
FIG_3

DEVICE FOR DETERMINING THE STATE OF CHARGE IN BATTERIES

CROSS REFERENCES TO RELATED APPLICATIONS

This application is a continuation-in-part of application Ser. No. 283,141, filed Aug. 23, 1972 now abandoned.

BACKGROUND OF THE INVENTION

1. Field of the Invention

The subject matter of the present invention relates generally to a means for determining the state of charge in batteries and more particularly to a means of measuring the state of charge of a battery by the use of a short term controlled discharge wherein the battery is discharged to its maximum capability so that when the measured power and potential at which the peak power occurs, the condition of the battery can be determined.

2. Description of the Prior Art

The problem of determining the energy available in an electrochemical system is generally considered a critical factor in the operation of the electrochemical system. Elaborate monitoring techniques have been used for monitoring batteries for space power systems. The search for a relatively simple device for monitoring batteries have been actively pursued by government agencies as well as industrial organizations.

The commercially available devices have been found to be very unsatisfactory because the resultant measurements are based on insufficient information. That is, the cell potential is not related to the amount of material present so that the potential measured under load does not necessarily indicate the state of charge.

SUMMARY OF THE INVENTION

The present invention provides a device for determining the state of charge in batteries. The battery under test is discharged in a linear manner by means of a control circuit. The product of the current and battery voltage is recorded until the battery power reaches maximum at the maximum power point. Two readings, peak power and the potential of the battery at the peak power, are held on meters by a peak read and hold circuits. From the readings obtained, the state of charge can be determined by using a calibration curve for the type of battery being tested. The unique method and means for determining the state of charge of a battery, which is the subject matter of the present invention, will overcome the aforementioned problems by determining the state of charge of the battery being tested by using the dynamic behavior of the battery over the whole range of currents and/or potentials available. The function allows an accurate determination of the state of charge of the battery under test since the measurements are based on the depth of penetration within the reaction zone of the electrode structure of the batteries which is proportional to the amount of material used and alternatively still available for reaction.

STATEMENT OF THE OBJECTS OF INVENTION

A primary object of the present invention is to provide a means for determining the state of charge in an electrochemical system.

Another object of the present invention is to provide the user of the electrochemical system with an instrument to indicate the amount of energy available by the active material present in the electrochemical system.

Other objects and many of the attendant advantages of this invention will be readily appreciated as the same becomes better understood by reference to the following detailed description when considered in connection with the accompanying drawings.

BRIEF DESCRIPTION OF THE DRAWINGS

FIG. 1 is a schematic diagram of the device for determining the state of charge in batteries;

FIG. 2 is a diagram of the internal structure of the electrochemical system or battery to be tested and to illustrate the principle of operation of the device shown in FIG. 1; and FIG. 3 is a graph illustrating a typical calibration curve used for the type of battery being tested in FIG. 1.

DESCRIPTION OF THE PREFERRED EMBODIMENTS

Referring now to FIG. 1 there is shown an electrochemical system or battery 25 to be tested. A series discharge path is provided from the positive terminal 29, through load resistor 27, current controller 23 to the negative terminal 31. In practicing the invention, it has been found that when using the Kepco Model BOP 36-5(m) power supply as the current controller 23, the sensing resistor of the power supply can also serve as the load resistor 27. Current controller 23 is essentially a power amplifier controlled to permit battery 25 to discharge with a linear increase in current. A variable ramp voltage generator 21 may be used to control current controller 23. Ramp generator 21 may be a function generator, Model G1103 manufactured by the Exact Company set to generate a variable ramp output voltage. The output of ramp generator 21 is connected through a relay 22 to current controller 23. The ramp voltage should be connected to the null point of the current controller 23 and should be adjusted so as to provide a zero current flow when the ramp signal is zero and to increase at a rate to cause an increase of approximately ¾ amp. per second.

In order to measure the power delivered by battery 25 during the test, a multiplier 19 is provided. Input terminals 10 and 12 are connected across load resistor 27 to provide a voltage proportional to the discharge current flowing through resistor 27 and terminals 12 and 14 are connected across the battery terminals 29 and 31 to provide the battery voltage. Multiplier 19 may be a Philbrick Model 4430. The output of multiplier 19 is a voltage proportional to the power output of battery 25 and is fed to peak read and hold circuit 17, the output of which is connected to a power meter 13. It is necessary to know what the output voltage of battery 25 is at the occurrence of peak power. This is accomplished by connecting a voltmeter to terminals 29 and 31 through a track and hold circuit 24 and relay 26. Peak read and hold circuit 17 and track and hold circuit 24 may be of the types shown and described in Application Manual for Computing Amplifiers published by George A. Philbrick Researchers, Inc. (1966).

In operation, with the current controller 23 adjusted such that no current is flowing in resistor 27, power meter 13 will read 0 and voltage meter 15 will read maximum. As ramp voltage from generator 21 increases, the voltage at the output of current controller 23 will allow current to flow through resistor 27 increasing in a linear manner. The power reading on power meter 13 will increase to a maximum while the voltage on voltage meter 15 will reduce in amplitude. The control circuit of relays 22 and 26 should be connected to sense the error voltage of the peak and read circuit 17 and should be biased to drop out when the error voltage goes to zero. The peak reading of peak and hold circuit 17 occurs when its error signal goes to zero. The drop-out of relay 22 causes current controller 23 to return the discharge current from battery 25 to zero while the peak power reading is held by circuit 17 and indicated on meter 13. The drop out of relay 26 disconnects track and hold circuit 24 from battery 25 and the voltage at which the peak reading occurred is held by circuit 24 and indicated on meter 15. From the readings obtained from meters 13 and 15 at peak power the state of charge of electrochemical system 25 or any similar electrochemical system can be determined by using the standard and particular calibration curve prepared for electrochemical system 25 or the specific type of electrochemical sytem to be tested.

It should be noted that other electrochemical systems or battery curves are available so that any other battery can be connected to device 11 to be tested within the physical limitations of device 11. The internal circuitry of device 11 may be modified to accept larger electrochemical systems and is within the scope of the subject matter of the present invention.

Referring to FIG. 2, the determination of the state of charge using the device 11, illustrated in FIG. 1, is based on the dynamic behavior of the particular electrochemical system or battery 25 being tested over the whole range of currents and/or potentials available. This allows an accurate determination of the state of charge since the measurements are based on the depth of penetration within the reaction zones of the electrochemical system electrode structure which is proportional to the amount of material used and alternately still available for reaction.

FIG. 2 is a schematic illustration of the internal structure of the battery illustrated in FIG. 1, or any other general electrochemical system where $V_i$ is the internal voltage, $V_e$ is the external voltage and $R_1$, $R_2$, $R_3$, $R_4$, and $R_5$ corresponds to the location of the reaction zones 1 – 5 in the electrode structures of the cathode. $R_o$ is the internal resistance of the separator between the cathode and anode.

FIG. 2 is used to describe the theory of operation of the device 11. In principle, the operation of the galvanic cell is by direct conversion of chemical energy into electrical energy. The amount of energy stored is in direct proportion to the active material available. In the course of a battery operation the supply of reactant diminishes and when all active material is consumed, the battery ceases to operate. It is therefore of interest to determine at any point, in the course of battery discharge, the amount of charge still available. It is well known that cell power plotted against cell voltage exhibits a peak or power maximum. This maximum power ($Pm$), also referred to as peak power, occurs when the external load is equal to the effective cell resistance. The effective cell resistance consists of several components, the ohmic time resistance in the electrolyte and the separator as well as the impedance due to the electrode reaction.

It is also known that electrodes in almost all practical batteries are constructed by pressing, or otherwise attaching, a mixture of active material dispersed in conductive matrix to the electrode grid. This electrode, usually in form of a pellet, is immersed in an electrolyte. Irrespective of the cell or electrode composition, the active material is being used as the cell delivers power. When all active material is used up, the cell ceases to function. As a rule, the depletion of active material takes place in a narrow segment of the electrode structure or reaction zone located in the vicinity of the electrode solution interface. As the reactant is being depleted, the reaction zone moves deeper into the electrode structure, thus increasing the effective coil resistance. In most cases, the increase in effective cell resistance is proportional to the active material used and, therefore, also to the material still available. This observation forms a basis for the practical determination of the state of charge. The maximum power ($Pm$) also occurs when the internal resistance is equal to the external resistance; then as the reaction zone moves through electrode zones 1 – 5, an additional increment of resistance, $R_1 - R_5$, limiting the peak power ($Pm$) is seen at the output. This value is proportional to the state of charge of the electrochemical system 25. As the current is drawn from the cell of the electrochemical system 25, the reaction zone extends deeper into the electrode structure. The rate at which the reaction zone penetrates the electrode structure is governed by the electrodensity of the system and construction of the electrodes, respectively. For a given battery type, the rate of penetration is a fixed quantity, thus providing a means of determining the state of charge of the electrochemical system 25 by reference to calibration curve for the particular electrochemical system. A calibration curve can be constructed by well known standard calculations. The typical curve for a particular electrochemical system, in this case a HgO(C)Zn battery BA 1516U, illustrated in FIG. 3 and tested by the unique device of FIG. 1.

Referring to FIG. 3 where a plot of the reciprocal of maximum or peak power ($Pm$) wherein dimensionless time ($t/tm$) for a particular electrochemical system (namely, the BA 1516U battery) is shown, the time base ($t/tm$) is normalized so that zero represents the initial value of a new freshly prepared battery while 1.0 represents the end of the useful life of the particular battery of the minimum voltage acceptable. The time base of dimensionless time ($t/m$) may be represented by hours of operation for a given device or for ampere hours used or any other similar or equivalent time base. The curve illustrated in FIG. 3 consists of two segments I and II. Segment I is rather steep and terminates when approximately 30% of the active material has been used. Segment II is less steep and extends to the point where all the active material has reacted, or the point of complete cell discharge. At the end of discharge there is a rapid increase of $1/Pm$. The construction of a calibration curve for a particular electrochemical system, or any electrochemical system, is well known to those skilled in the art.

The device 11, illustrated in FIG. 1, is designed to measure the state of charge of an electrochemical system by means of a short term controlled discharge for about seven seconds or less. The power of the electrochemical system is measured when it is discharging at its maximum capability. From the measured power and potential at which the peak power and potential at which the peak power occurred, the condition of the electrochemical system can be determined.

When large batteries or electrochemical devices are used, that is, when it becomes impractical to discharge the particular device to be tested as to its capacity, the peak power and the potential at peak power may be calculated from the values recorded below the peak power. In this way the application of the method may be extended to large size electrochemical systems and still use the same or similar circuitry, as illustrated in FIG. 1.

Obviously many modifications and variations of the present invention are possible in the light of the above teachings. It is therefore to be understood that within the scope of the appended claims the invention may be practiced otherwise than as specifically described.

What is claimed is:

1. A device for determining the state of charge in an electrochemical system said system comprising in combination:
   a. power measuring means connected to said electrochemical system having an output voltage proportional to the power output of said electrochemical system,
   b. peak read and hold circuit means connected to said power measuring means and providing a first output that is proportional to the output voltage of said power measuring means and a second output that is proportional to the error signal of said peak read and hold circuit,
   c. power indicating means connected to the first output of said peak read and hold circuit means,
   d. a current control means coupled to said electrochemical system for controlling the current flow from said electrochemical system to increase in a linear manner;
   e. a means for generating a ramp function signal coupled to said current control means for controlling said current control means in a linear manner.
   f. track and hold circuit means coupled to said electrochemical system for providing an output voltage proportional to the output voltage of said electrochemical system,
   g. voltage indicating means connected to the output of said track and hold circuit means,
   h. first control means coupled between said current control means and said ramp function signal generating means and having an input connected to said second output of said peak read and hold circuit means for disconnecting said ramp function signal generating means from said current control means in response to a predetermined value of said error signal,
   i. second control means coupled between said track and hold circuit means and said electrochemical system and having an input connected to said second output of said peak read and hold circuit means for disconnecting said track and hold circuit means for said electrochemical system in response to said predetermined value of said error signal.

2. A device for determining the state of charge in an electrochemical system said system comprising in combination:
   a. first circuit means coupled to said electrochemical system for measuring and holding the power output of said electrochemical system,
   b. second circuit means coupled to said electrochemical system for controlling the current flow from said electrochemical system to increase in a linear manner,
   c. third means coupled to said electrochemical system for measuring and holding the voltage across the output of said electrochemical system,
   d. fourth circuit means connected to said first and second circuit means for disconnecting said second circuit means from said electrochemical system in response to a sensed peak power signal,
   e. fifth circuit means connected to said first and third circuit means for disconnecting said third circuit means from said electrochemical system in response to said sensed peak power signal,
   f. first and second indicator means connected respectively to said first and third circuit means for indicating respectively the output power and output voltage of said electrochemical system when said fourth and fifth circuit means disconnect said second and third circuit means respectively from said electrochemical system.

* * * * *